US008823008B2

(12) United States Patent
Park et al.

(10) Patent No.: US 8,823,008 B2
(45) Date of Patent: Sep. 2, 2014

(54) ORGANIC LIGHT EMITTING DISPLAY DEVICE AND METHOD FOR MANUFACTURING THE SAME

(75) Inventors: Sun Park, Yongin (KR); Jong-Hyun Park, Yongin (KR); Yul-Kyu Lee, Yongin (KR); Dae-Woo Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 404 days.

(21) Appl. No.: 13/094,632

(22) Filed: Apr. 26, 2011

(65) Prior Publication Data

US 2012/0132920 A1 May 31, 2012

(30) Foreign Application Priority Data

Nov. 25, 2010 (KR) .................. 10-2010-0118334

(51) Int. Cl.
  *H01L 29/12* (2006.01)
  *H01L 29/786* (2006.01)
(52) U.S. Cl.
  USPC ...... 257/71; 257/306; 257/532; 257/E51.003; 257/E21.008; 257/E21.011
(58) Field of Classification Search
  USPC ............... 257/68, 71, 72, 296, 306, 516, 535, 257/E51.003, E51.025, E27.034, E27.048, 257/E21.008, E21.011
  See application file for complete search history.

(56) References Cited

U.S. PATENT DOCUMENTS

| 2007/0109467 A1* | 5/2007 | Chang et al. .................. 349/106 |
| 2007/0152217 A1* | 7/2007 | Lai et al. .......................... 257/59 |
| 2009/0173943 A1* | 7/2009 | Yu et al. ........................... 257/59 |

FOREIGN PATENT DOCUMENTS

| KR | 10-2002-0056076 | 7/2002 |
| KR | 10-2005-0096541 | 10/2005 |
| KR | 10-2009-0060047 | 6/2009 |

* cited by examiner

*Primary Examiner* — Benjamin Sandvik
*Assistant Examiner* — Leslie Pilar Cruz
(74) *Attorney, Agent, or Firm* — Robert E. Bushnell, Esq.

(57) ABSTRACT

In an organic light emitting diode (OLED) display and a manufacturing method, an organic light emitting diode (OLED) display includes: a substrate; a semiconductor layer pattern formed on the substrate and including a first capacitor electrode; a gate insulating layer covering the semiconductor layer pattern; a first conductive layer pattern formed on the gate insulating layer and including a second capacitor electrode having at least a portion overlapping the first capacitor electrode; an interlayer insulating layer having a capacitor opening exposing a portion of the second capacitor electrode and covering the second capacitor electrode; and a second conductive layer pattern formed on the interlayer insulating layer, wherein the capacitor opening includes a first transverse side wall parallel to and overlapping the second capacitor electrode, a second transverse side wall parallel to and not overlapping the second capacitor electrode, and a longitudinal side wall connecting the first transverse side wall and the second transverse side wall to each other and overlapping the first capacitor electrode.

11 Claims, 23 Drawing Sheets

ORGANIC LIGHT EMITTING DISPLAY DEVICE AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 25$^{th}$ of Nov. 2010 and there duly assigned Serial No. 10-2010-0118334.

BACKGROUND OF THE INVENTION

1. Field of the Invention

The present invention relates generally to an organic light emitting diode (OLED) display having a semiconductor layer used as one electrode of a capacitor, and a manufacturing method thereof.

2. Description of the Related Art

An organic light emitting diode (OLED) display has been paid much attention as a next-generation display because of its merits such as a wide viewing angle, a fast response rate, and relatively less power consumption, as well as a lesser weight and a slim size.

The organic light emitting diode (OLED) display includes a thin film transistor, an organic light emitting element, and a capacitor. Here, both electrodes of the capacitor may be made of a metal layer, or one electrode may be made of a metal layer and the other electrode may be made of a semiconductor layer.

On the other hand, when the semiconductor layer is used as one electrode of the capacitor, the semiconductor layer is generally doped with an impurity to improve conductivity. However, if the impurity is not doped to a portion of the semiconductor layer used as one electrode of the capacitor by a limitation of a manufacturing process, the whole characteristics of the organic light emitting diode (OLED) display are deteriorated.

The above information disclosed in this Background section is only for enhancement of understanding of the background of the described technology and therefore it may contain information that does not form the prior art that is already known in this country to a person of ordinary skill in the art.

SUMMARY OF THE INVENTION

An exemplary embodiment provides an organic light emitting diode (OLED) display suppressing generation of deterioration due to non-doping of an impurity at a portion of a semiconductor layer used as one electrode of a capacitor.

Also, a manufacturing method of the organic light emitting diode (OLED) display is provided.

An organic light emitting diode (OLED) display according to an exemplary embodiment includes: a substrate; a semiconductor layer pattern formed on the substrate and including a first capacitor electrode; a gate insulating layer covering the semiconductor layer pattern; a first conductive layer pattern formed on the gate insulating layer and including a second capacitor electrode having at least a portion overlapping the first capacitor electrode; an interlayer insulating layer having a capacitor opening exposing the portion of the second capacitor electrode and covering the second capacitor electrode; and a second conductive layer pattern formed on the interlayer insulating layer, wherein the capacitor opening includes a first transverse side wall parallel to and overlapping the second capacitor electrode, a second transverse side wall parallel to and not overlapping the second capacitor electrode, and a longitudinal side wall connecting the first transverse side wall and the second transverse side wall to each other and overlapping the first capacitor electrode.

The first capacitor electrode overlapping the longitudinal side wall of the capacitor opening may be a semiconductor layer doped with an impurity.

Also, an organic light emitting diode (OLED) display according to another exemplary embodiment includes: a substrate; a semiconductor layer pattern formed on the substrate and including a first capacitor electrode; a gate insulating layer covering the semiconductor layer pattern; a first conductive layer pattern formed on the gate insulating layer and including a second capacitor electrode having at least a portion overlapping the first capacitor electrode; an interlayer insulating layer including a capacitor opening exposing a portion of the second capacitor electrode and at least one doping hole overlapping the second capacitor electrode and the first capacitor electrode and exposing a portion of the second capacitor electrode near the capacitor opening, and covering the second capacitor electrode; and a second conductive layer pattern formed on the interlayer insulating layer.

The first capacitor electrode overlapping at least one doping hole may be a semiconductor layer doped with an impurity.

A portion of a region of the first conductive layer pattern may be formed of a single transparent conductive layer, and another portion of the region is formed of a transparent conductive layer and a plurality of metal layers deposited on the transparent conductive layer.

The capacitor opening may be formed through an etching process, and the etching process may include a cleaning process using a solution including hydrofluoric acid (HF).

At least one of metal layer among the plurality of metal layers except for the highest layer is relatively more easily eroded by the hydrofluoric acid solution than the highest layer.

At least one metal layer among the plurality of metal layers except for the highest layer may include aluminum.

At least a portion of the second capacitor electrode of the first conductive layer pattern exposed through the capacitor opening may be formed of a single transparent conductive layer.

The first capacitor electrode overlapping the second capacitor electrode formed of the single transparent conductive layer may be doped with an impurity.

A manufacturing method of an organic light emitting diode (OLED) display according to an exemplary embodiment includes: providing a substrate; forming a semiconductor layer pattern including a first capacitor electrode on the substrate; forming a gate insulating layer covering the semiconductor layer pattern; forming a first conductive layer pattern intermediate including a second capacitor electrode intermediate having at least a portion overlapping the first capacitor electrode on the gate insulating layer; forming an interlayer insulating layer having a capacitor opening exposing a portion of the second capacitor electrode intermediate and covering the first conductive layer pattern intermediate; and partially etching the first conductive layer pattern intermediate while forming the second conductive layer pattern on the interlayer insulating layer to complete the first conductive layer pattern. The capacitor opening includes a first transverse side wall parallel to and overlapping the second capacitor electrode, a second transverse side wall parallel to and not overlapping the second capacitor electrode, and a longitudinal side wall connecting the first transverse side wall and the second transverse side wall to each other and overlapping the first capacitor electrode.

The first capacitor electrode overlapping the longitudinal side wall of the capacitor opening may be a semiconductor layer doped with an impurity.

A manufacturing method of an organic light emitting diode (OLED) display according to another exemplary embodiment includes: providing a substrate; forming a semiconductor layer pattern including a first capacitor electrode on the substrate; forming a gate insulating layer covering the semiconductor layer pattern; forming a first conductive layer pattern intermediate including a second capacitor electrode intermediate having at least a portion overlapping the first capacitor electrode on the gate insulating layer; forming an interlayer insulating layer including a capacitor opening exposing a portion of the second capacitor electrode and at least one doping hole overlapping the second capacitor electrode and the first capacitor electrode and exposing a portion of the second capacitor electrode near the capacitor opening, and covering the second capacitor electrode; and partially etching the first conductive layer pattern intermediate while forming the second conductive layer pattern on the interlayer insulating layer to complete the first conductive layer pattern.

Doping an impurity to the first capacitor electrode through at least one of doping hole may be further included.

In the manufacturing method of the organic light emitting diode (OLED) display, a portion of a region of the first conductive layer pattern may be formed of a single transparent conductive layer, and another portion of the region is formed of a transparent conductive layer and a plurality of metal layers deposited on the transparent conductive layer.

The capacitor opening may be formed through an etching process, and the etching process may include a cleaning process using a solution including hydrofluoric acid (HF).

At least one metal layer among the plurality of metal layers except for the highest layer may be relatively more easily eroded by the hydrofluoric acid solution than the highest layer.

At least one metal layer among the plurality of metal layers except for the highest layer may include aluminum.

At least a portion of the second capacitor electrode of the first conductive layer pattern exposed through the capacitor opening may be formed of the single transparent conductive layer.

The first capacitor electrode overlapping the second capacitor electrode formed of the single transparent conductive layer may be doped with an impurity.

According to an exemplary embodiment, the organic light emitting diode (OLED) display may suppress deterioration generated by one region where the impurity is doped in the semiconductor layer that is used as one electrode of the capacitor.

Also, the manufacturing method of the organic light emitting diode (OLED) display is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 1 illustrates a first process of forming semiconductor layer patterns on a substrate according to the first exemplary embodiment;

FIG. 2 illustrates a cross-sectional view of a portion of FIG. 1 corresponding to line II-II;

FIG. 3 illustrates a next process of forming first conductive layer pattern intermediates on the substrate according to the first exemplary embodiment;

FIG. 4 illustrates a cross-sectional view of a portion of FIG. 3 corresponding to line IV-IV;

FIG. 5 and FIG. 6 illustrate a next process of forming and etching an interlayer insulating layer covering the first conductive layer pattern intermediates of FIG. 4;

FIG. 7 is a close-up view of a portion of FIG. 6 adjacent lines VIII-VIII and IX-IX;

FIG. 8 and FIG. 9 are cross-sectional views the first exemplary embodiment resulting from the etching of the interlayer insulating layer corresponding to lines VIII-VIII and IX-IX, respectively;

FIG. 10 and FIG. 11 illustrate a next process of forming a second conductive layer pattern covering exposed surfaces of the layers shown in FIGS. 8 and 9, respectively;

FIG. 12 and FIG. 13 illustrate a next process of forming a photoresist layer on the patterns shown in FIGS. 10 and 11, respectively;

FIG. 14 and FIG. 15 illustrate a next process of patterning the photoresist layer and performing a photolithography process on the patterns shown in FIGS. 12 and 13, respectively;

FIG. 16 and FIG. 17 illustrate layout views of the patterns formed by the processes of FIGS. 1-15.

FIG. 18 and FIG. 19 illustrate a perspective view of patterns formed by a processes of the second exemplary embodiment, where FIG. 19 is a close-up view of FIG. 18 adjacent line XX-XX;

FIG. 20 illustrates a cross-sectional view of a portion of FIG. 19 corresponding to line XX-XX;

FIG. 21 illustrates a next process of forming a second conductive layer pattern and a photoresist layer on the substrate according to the second exemplary embodiment;

FIG. 22 illustrates a next process of patterning the photoresist layer and performing a photolithography process; and FIG. 23 illustrates a layout view of the patterns forming the organic light emitting diode (OLED) display by the processes of FIGS. 18-22.

DETAILED DESCRIPTION OF THE INVENTION

Figure 1:
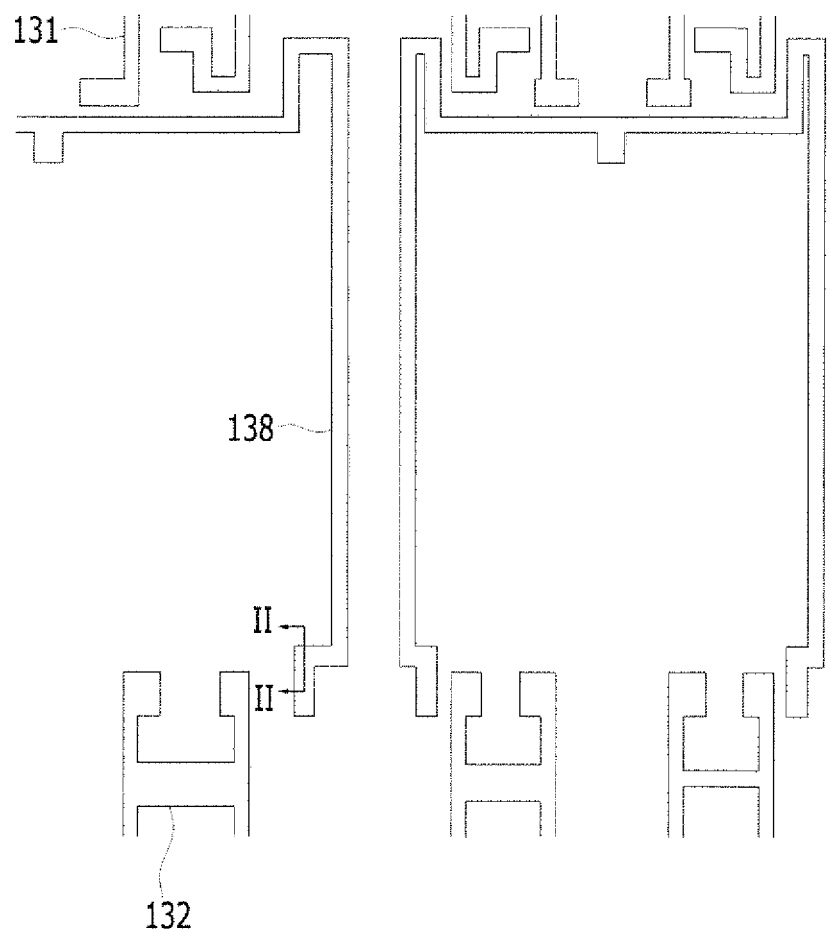
FIG. 1 to FIG. 17 are layout views and cross-sectional views sequentially showing a manufacturing process of an organic light emitting diode (OLED) display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. In addition, herein, the first exemplary embodiment will be mainly described, and other exemplary embodiments will be primarily described with regard to configurations other than those of the first exemplary embodiment.

In addition, the size and thickness of each component shown in the drawings are arbitrarily shown for understanding and ease of description, but the present invention is not limited thereto. In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

Next, an organic light emitting diode (OLED) display 101 and a manufacturing method thereof according to the first exemplary embodiment will be described with reference to FIG. 1 to FIG. 17.

Firstly, a manufacturing method of an organic light emitting diode (OLED) display 101 according to the first exemplary embodiment will be described focusing on a first thin film transistor 10, a second thin film transistor 20, and a capacitor 80 according to a deposition sequence (see FIG. 16 and FIG. 23). Particularly, one region where both electrodes of the capacitor 80 are intersected will be described in detail.

Figure 2:
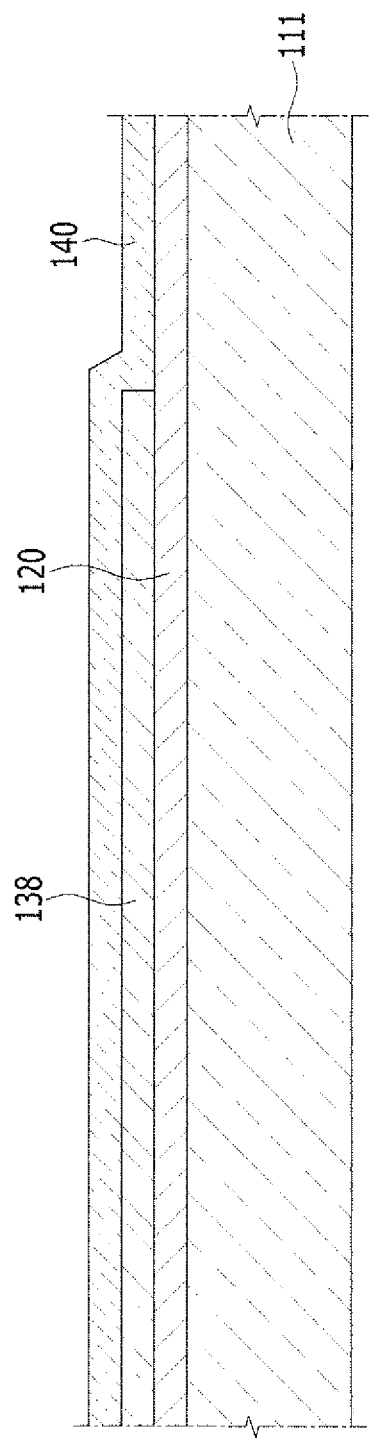

As shown in FIG. 1 and FIG. 2, illustrate a first process of forming semiconductor layer patterns on a substrate, where FIG. 2 is a cross-sectional view taken at line II-II of FIG. 1.

In FIG. 2, a buffer layer 120 is formed on a substrate 111.

The substrate 111 is formed as a transparent insulating substrate made of glass, quartz, ceramic, or plastic. However, an exemplary embodiment is not limited thereto. Also, when the substrate 111 is made of plastic, the substrate 111 may be a flexible substrate.

The buffer layer 120 is formed to be a single layer or multiple layers including at least one of a silicon oxide layer and a silicon nitride layer by using chemical vapor deposition or physical vapor deposition, which are known to a person skilled in the art.

The buffer layer 120 prevents diffusion or penetration of moisture or impurities generated from the substrate 111, smooths the surface, and controls the transmission speed of heat during a crystallization process for forming a semiconductor layer.

The buffer layer 120 can be omitted depending on types of the substrate 111 and process conditions.

Next, as shown in FIG. 1, semiconductor layer patterns 131, 132, and 138 are formed on the buffer layer 120. The semiconductor layer patterns 131, 132, and 138 include a plurality of active layers 131 and 132 and a first capacitor electrode 138. The semiconductor layer patterns 131, 132, and 138 are formed of a polysilicon layer. The polysilicon layer may be formed with a method in which amorphous silicon is formed and is then crystallized. The crystallizing of the amorphous silicon layer may be carried out using various crystallization methods known to a skilled person in the art.

Next, a gate insulating layer 140 covering the semiconductor layer patterns 131, 132, and 138 is formed. The gate insulating layer 140 is formed using any of various insulating materials known to a person skilled in the art, such as tetraethyl orthosilicate (TEOS), silicon nitride (SiNx), and silicon oxide ($SiO_2$).

Figure 3:
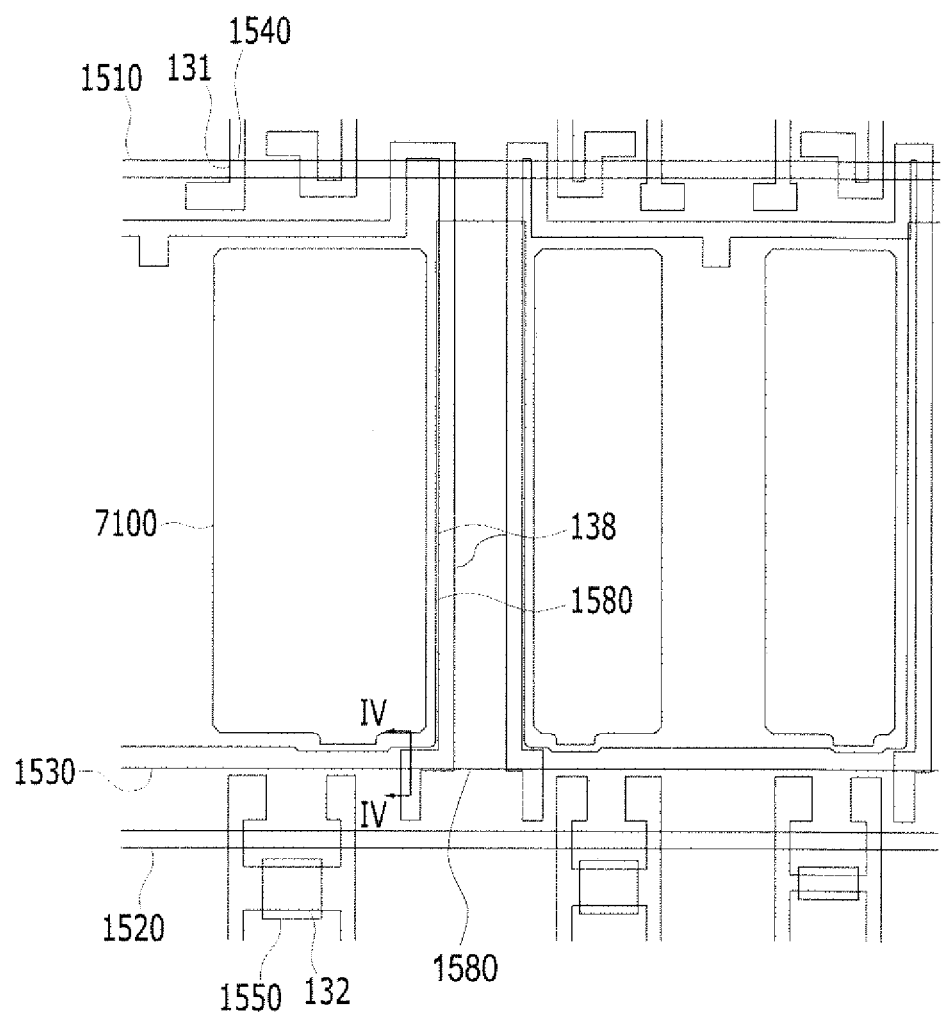
Figure 4:
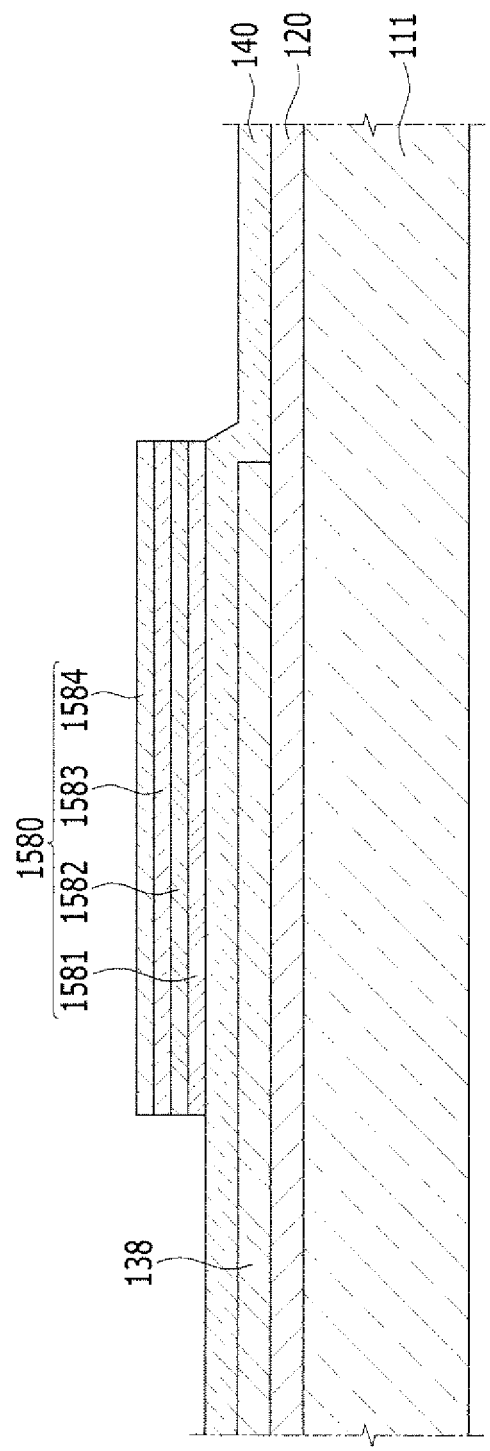

Next, as shown in FIG. 3 and FIG. 4, illustrate a next process of forming first conductive layer pattern intermediates on the substrate, where FIG. 4 is a cross-sectional view taken at line IV-IV of FIG. 3, line IV-IV being coincident with line II-II of FIG. 1.

As shown in FIG. 3, first conductive layer pattern intermediates 1510, 1520, 1530, 1540, 1550, 1580, and 7100 are formed, wherein the first conductive layer pattern intermediate 1580 comprises a second capacitor electrode intermediate 1580, and the first conductive layer pattern intermediate 7100 comprises a pixel electrode intermediate 7100.

As shown in FIG. 4, the second capacitor electrode intermediate 1580 includes a transparent conductive layer 1581 and a plurality of metal layers 1582, 1583, and 1584 deposited on the transparent conductive layer 1581. The other first conductive layer pattern intermediates 1510, 1520, 1530, 1540, 1550, and 7100 (not shown in FIG. 4) basically have a multi-layer structure like the second capacitor electrode intermediate 1580.

At least one metal layer 1582 or 1583 of the second capacitor electrode intermediate 1580 is made of a metal that is relatively easier eroded than the highest metal layer 1584 with a hydrofluoric acid (HF) solution. For example, at least one metal layer 1582 or 1583 of the plurality of metal layers 1582, 1583, and 1584 includes aluminum. In detail, the plurality of metal layers 1582, 1583, and 1584 may have a structure in which molybdenum (Mo)/aluminum (Al)/molybdenum (Mo) are deposited.

Figure 5:
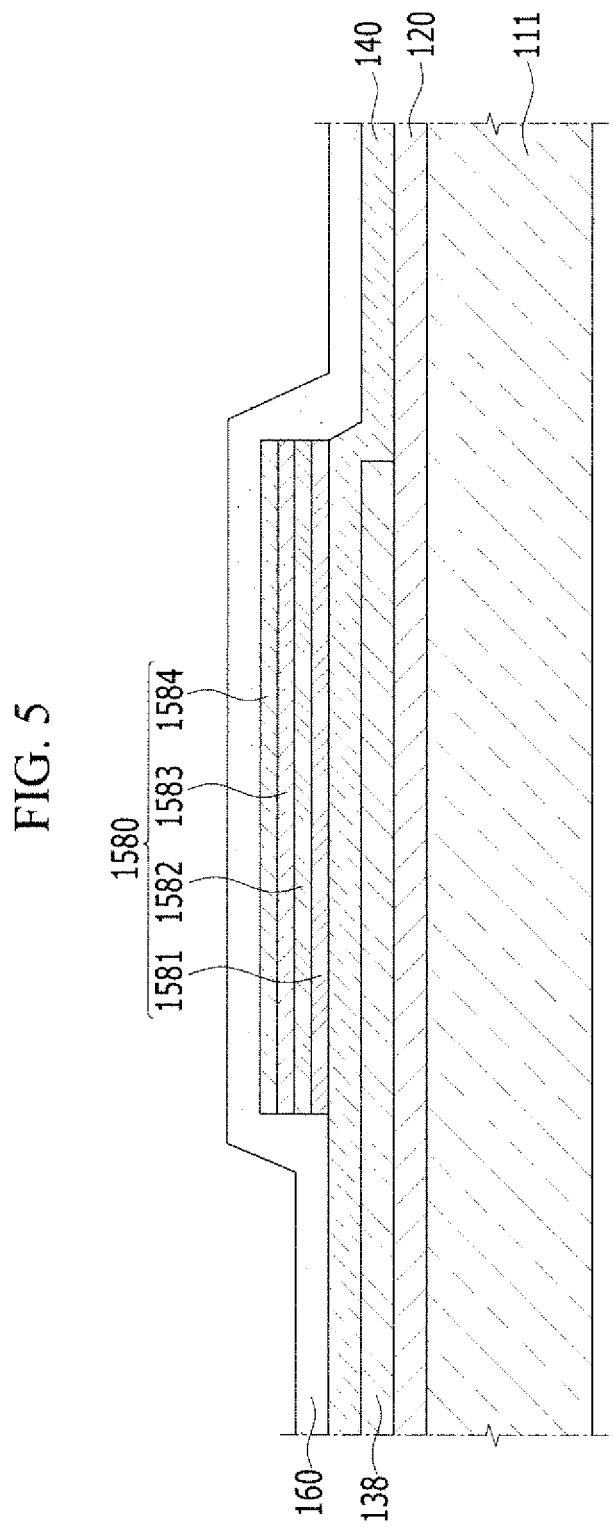
Figure 6:
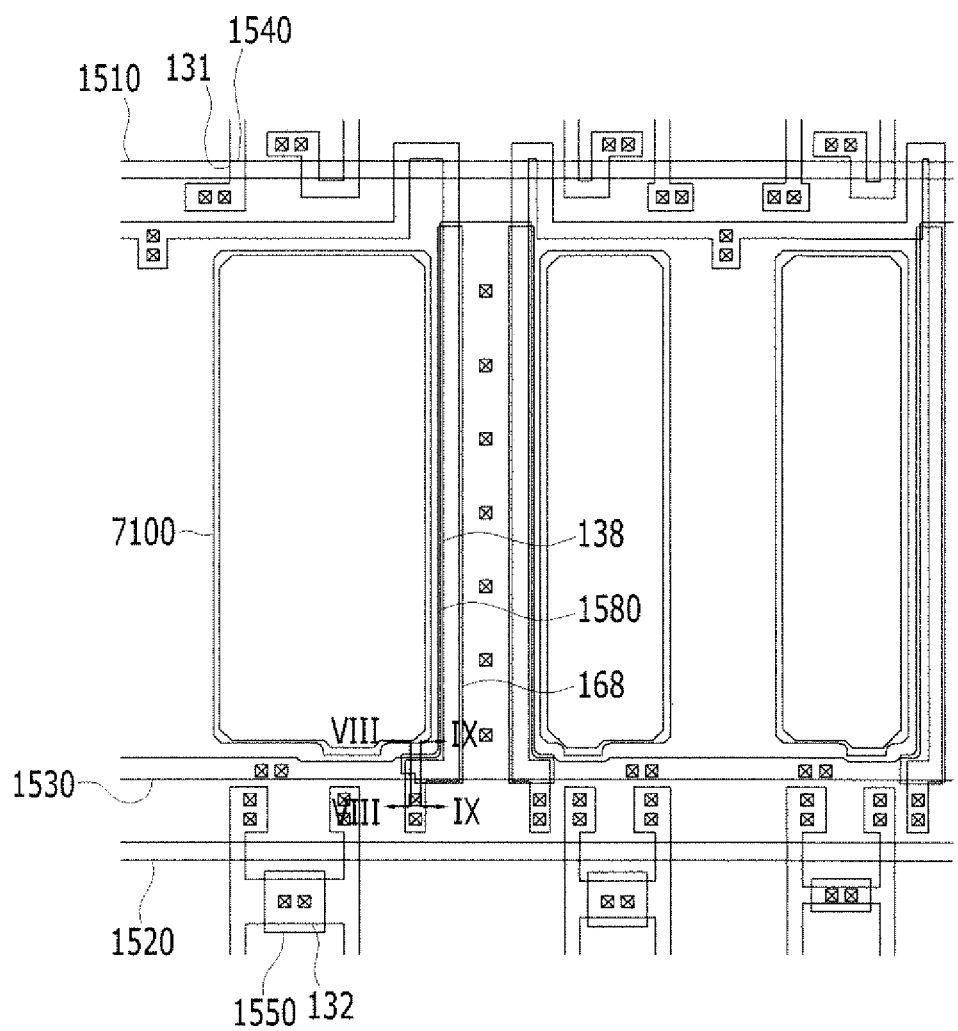

Next, FIG. 5 and FIG. 6 illustrate a next process of forming and etching an interlayer insulating layer covering the first conductive layer pattern intermediates of FIG. 4

As shown in FIG. 5, an interlayer insulating layer 160 covering the first conductive layer pattern intermediates 1510, 1520, 1530, 1540, 1550, and 1580 is formed.

Also, as shown in FIG. 6, a portion of the interlayer insulating layer 160 is etched to form a capacitor opening 168 exposing a portion of the second capacitor electrode intermediate 1580. Here, an opening exposing all or a portion of the pixel electrode intermediate 7100 may be formed along with the capacitor opening 168.

Figure 7:
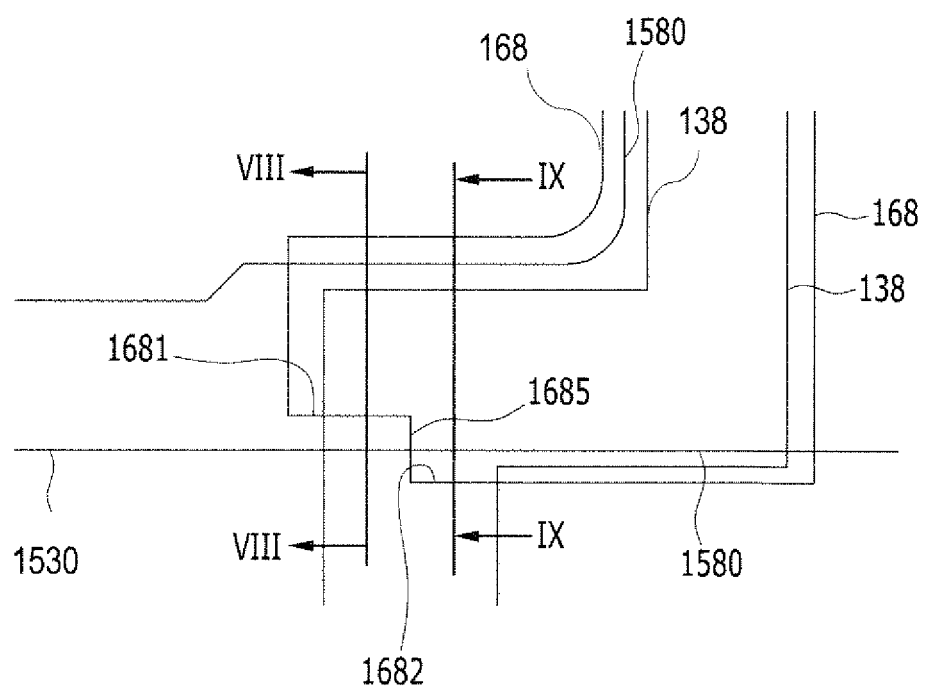

FIG. 7 is a close-up view of a portion of FIG. 6 near lines VIII-VIII and IX-IX.

As shown in FIG. 7, the capacitor opening 168 includes a first transverse side wall 1681 parallel to and overlapping a second capacitor electrode 1580, a second transverse side wall 1682 parallel to and not overlapping the second capacitor electrode 1580, and a longitudinal side wall 1685 connecting the first transverse side wall 1681 and the second transverse side wall 1682 and overlapping the first capacitor electrode 138.

The etching process for forming the capacitor opening 168 includes a cleaning process using a solution including hydrofluoric acid (HF).

Figure 8:
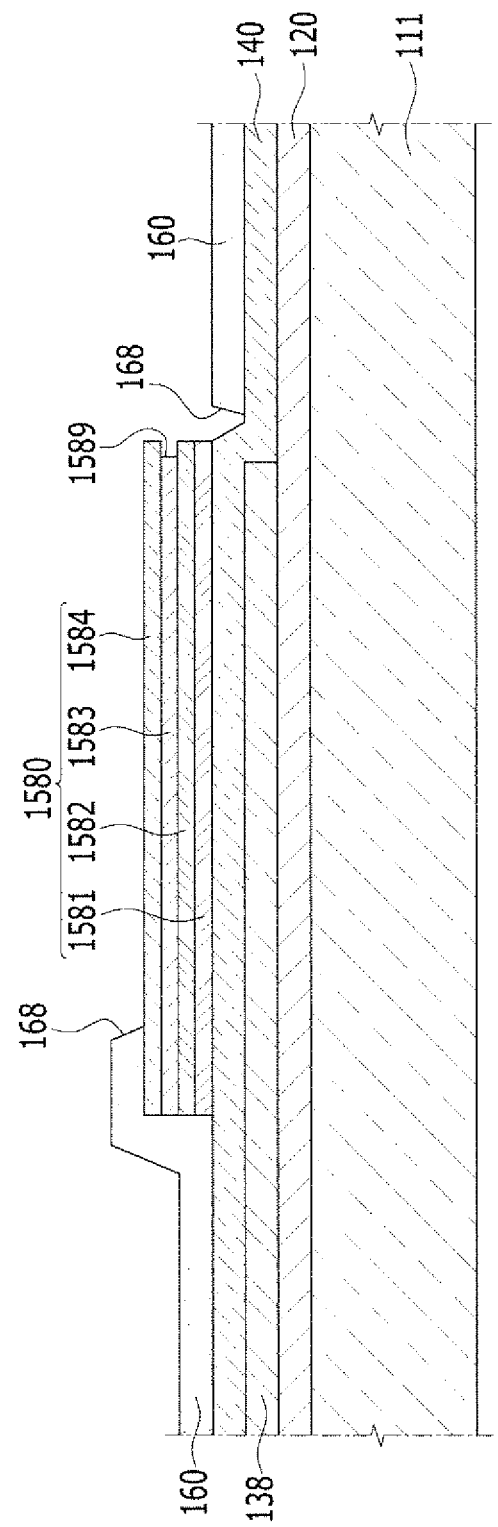
Figure 9:
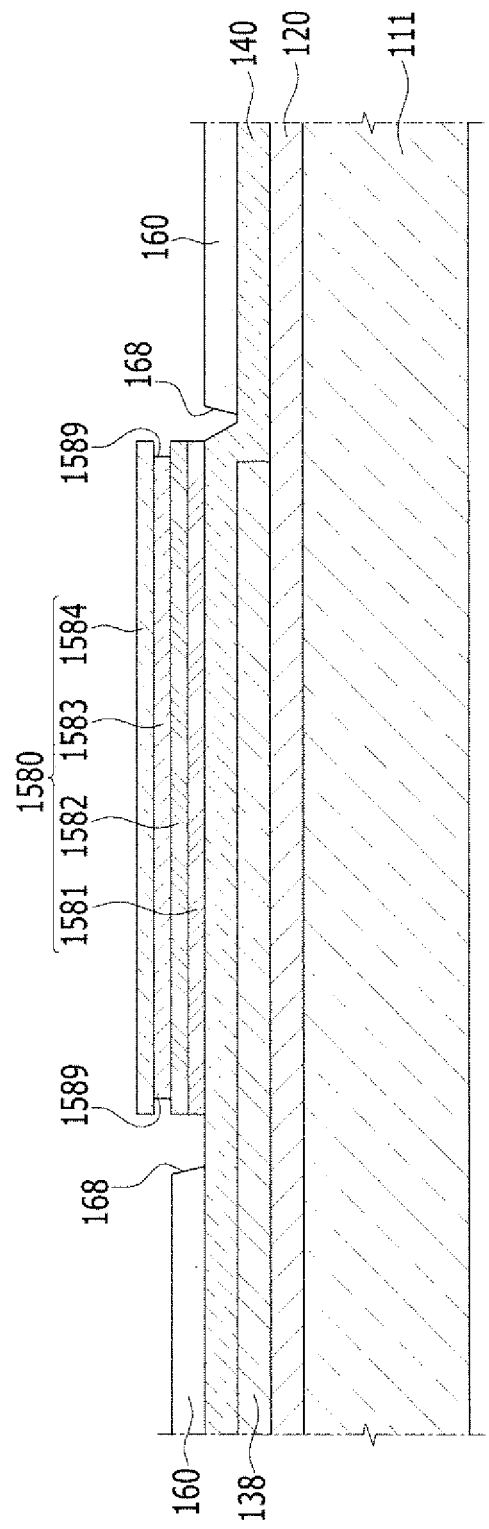

FIG. 8 and FIG. 9 are cross-sectional views the first exemplary embodiment resulting from the etching of the interlayer insulating layer corresponding to lines VIII-VIII and IX-IX, respectively, line VIII-VIII being coincident with line II-II of FIG. 1.

Accordingly, as shown in FIG. 8 and FIG. 9, an undercut 1589 is generated in the second capacitor electrode intermediate 1580 having the side surface exposed through the capacitor opening 168 of the interlayer insulating layer 160. This is because the at least one metal layer (1583) of the plurality of metal layers 1582 or 1583 is eroded by the hydrofluoric acid solution. The undercut 1589 is generated at the side surface of the second capacitor electrode intermediate 1580 facing the second transverse side wall 1682 that is parallel to and does not overlap the second capacitor electrode intermediate 1580.

Figure 10:
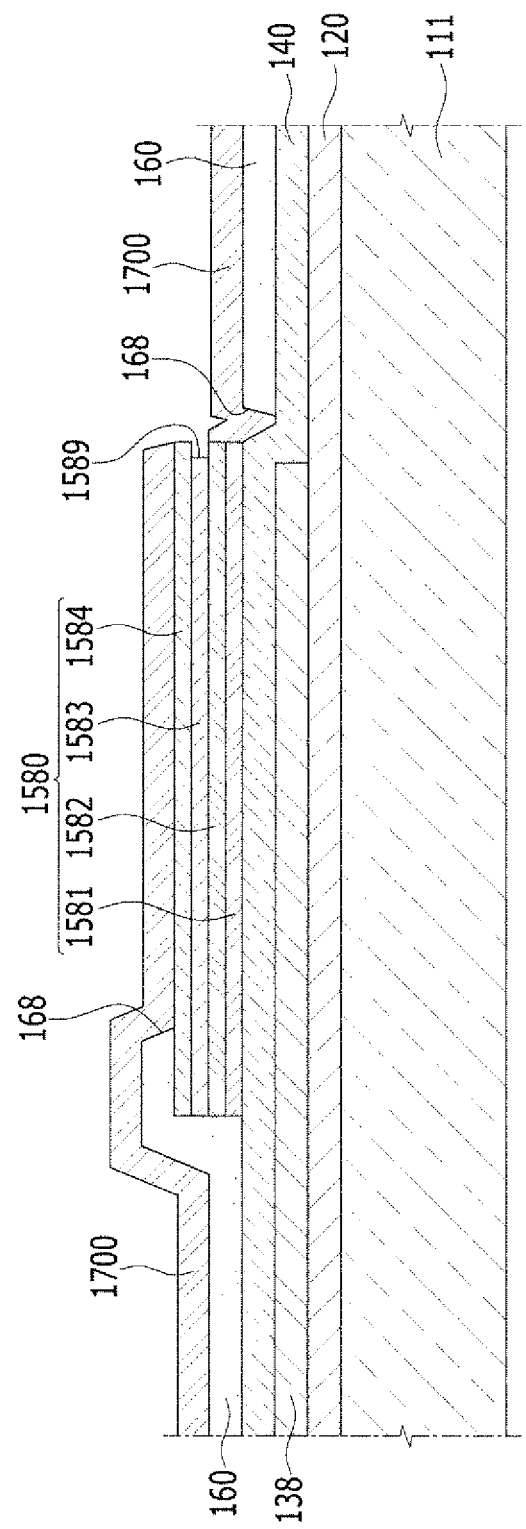
Figure 11:
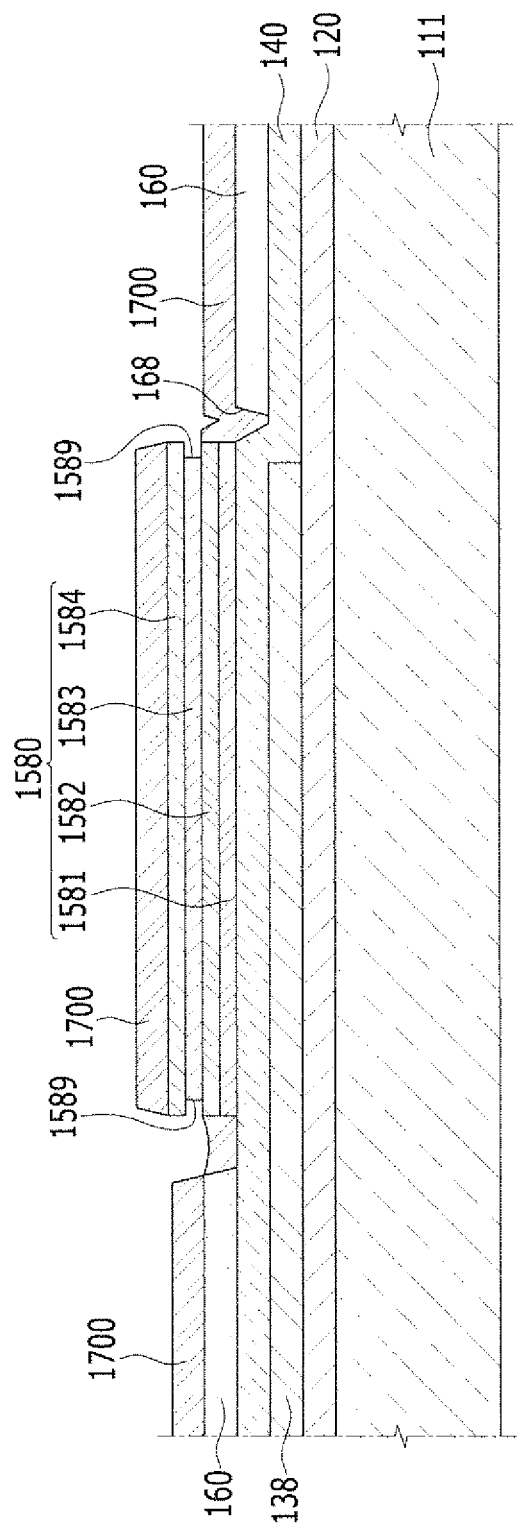

Next, FIG. 10 and FIG. 11 illustrate a next process of forming a second conductive layer pattern covering exposed surfaces of the layers shown in FIGS. 8 and 9, respectively.

As shown in FIG. 10 and FIG. 11, a conductive layer 1700 for forming a second conductive layer pattern is formed on the interlayer insulating layer 160 and the exposed upper surface portions of second capacitor electrode intermediate 1580 and gate insulating layer 140. Accordingly, side portions of second capacitor electrode intermediate 1580 remain exposed. The conductive layer 1700 includes a metal layer. A portion of the conductive layer 1700 may be disconnected by the stepped height generated by the capacitor opening 168 of the interlayer insulating layer 160.

Figure 12:
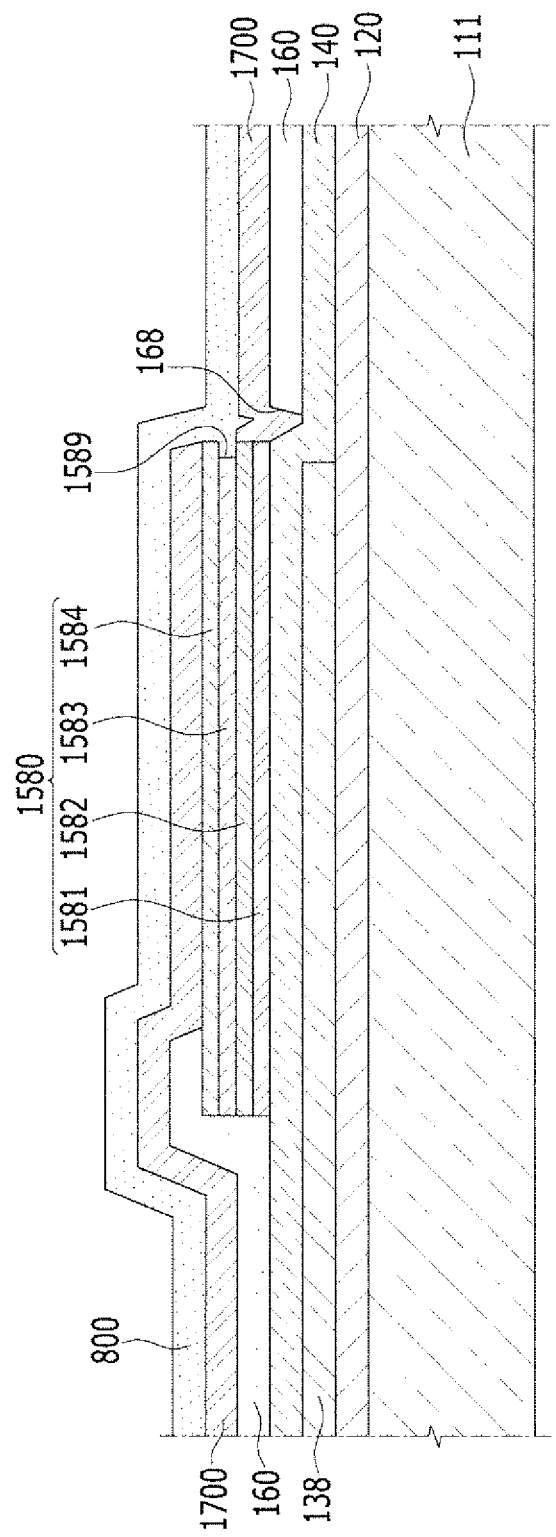
Figure 13:
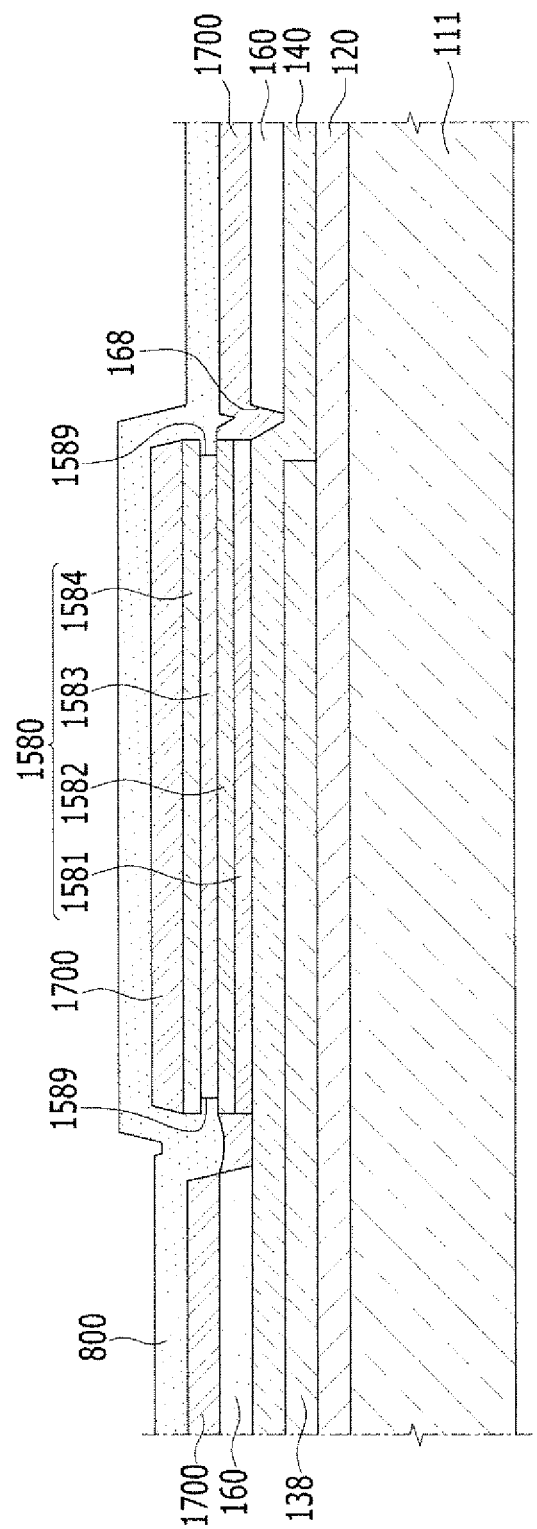

Next, FIG. 12 and FIG. 13 illustrate a next process of forming a photoresist layer on the patterns shown in FIGS. 10 and 11, respectively.

As shown in FIG. 12 and FIG. 13, a photoresist layer 800 is coated on the above-described conductive layer 1700 and remaining exposed side portions of second capacitor electrode intermediate 1580.

Figure 14:
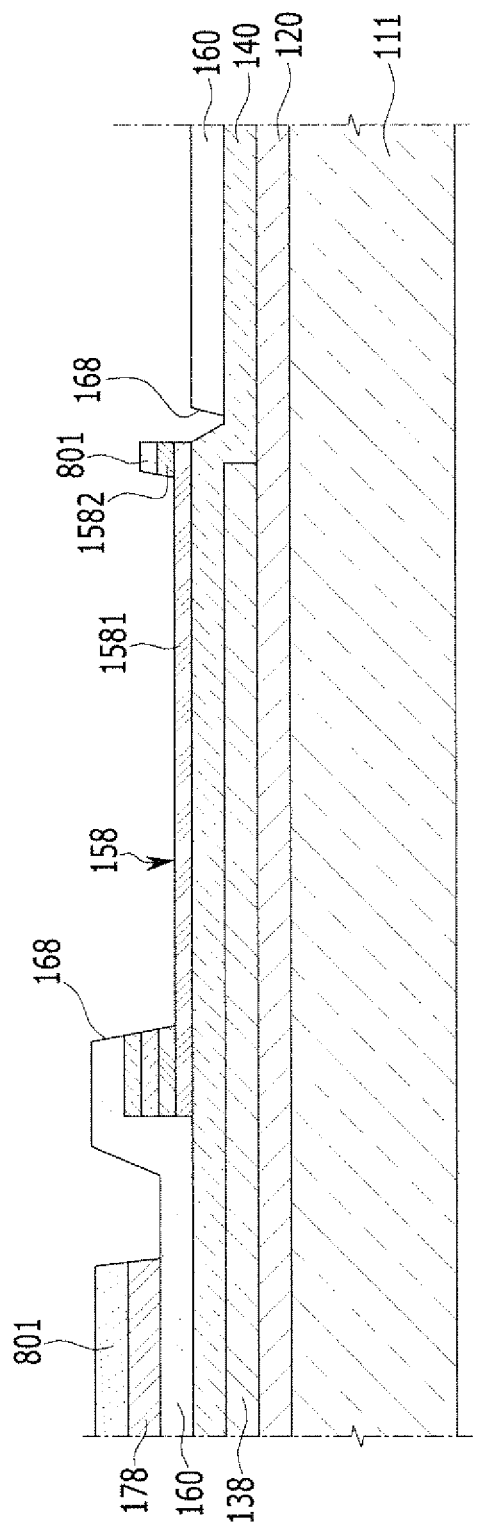
Figure 15:
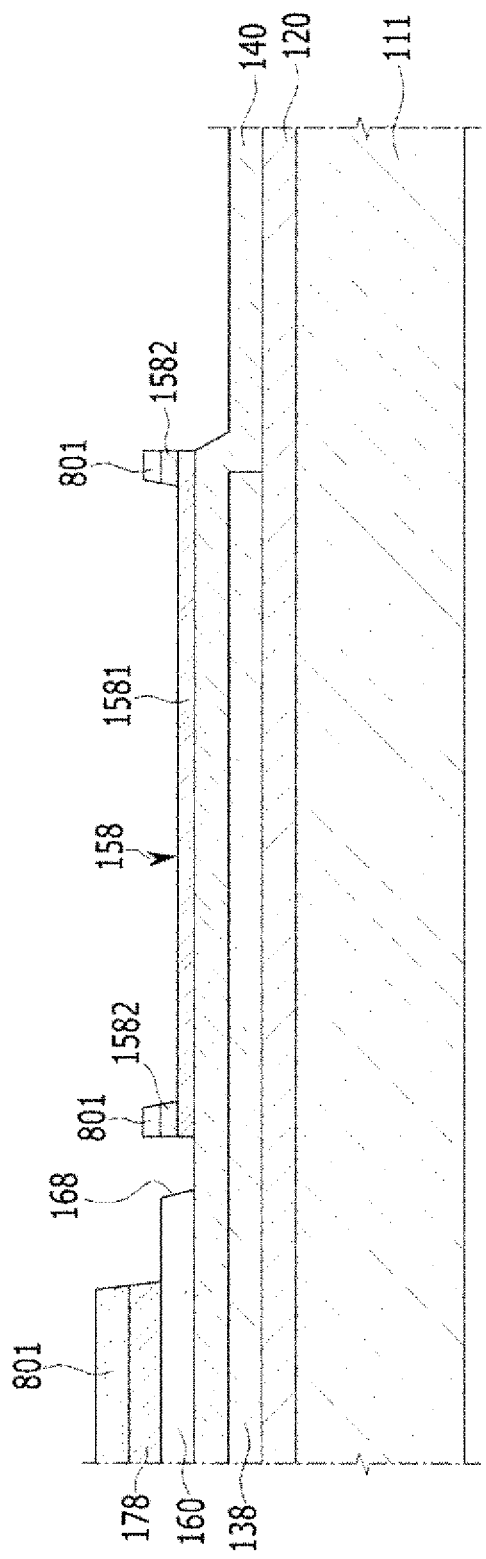

Next, FIG. 14 and FIG. 15 illustrate a next process of patterning the photoresist layer and performing a photolithography process on the patterns shown in FIGS. 12 and 13, respectively.

Figure 16:
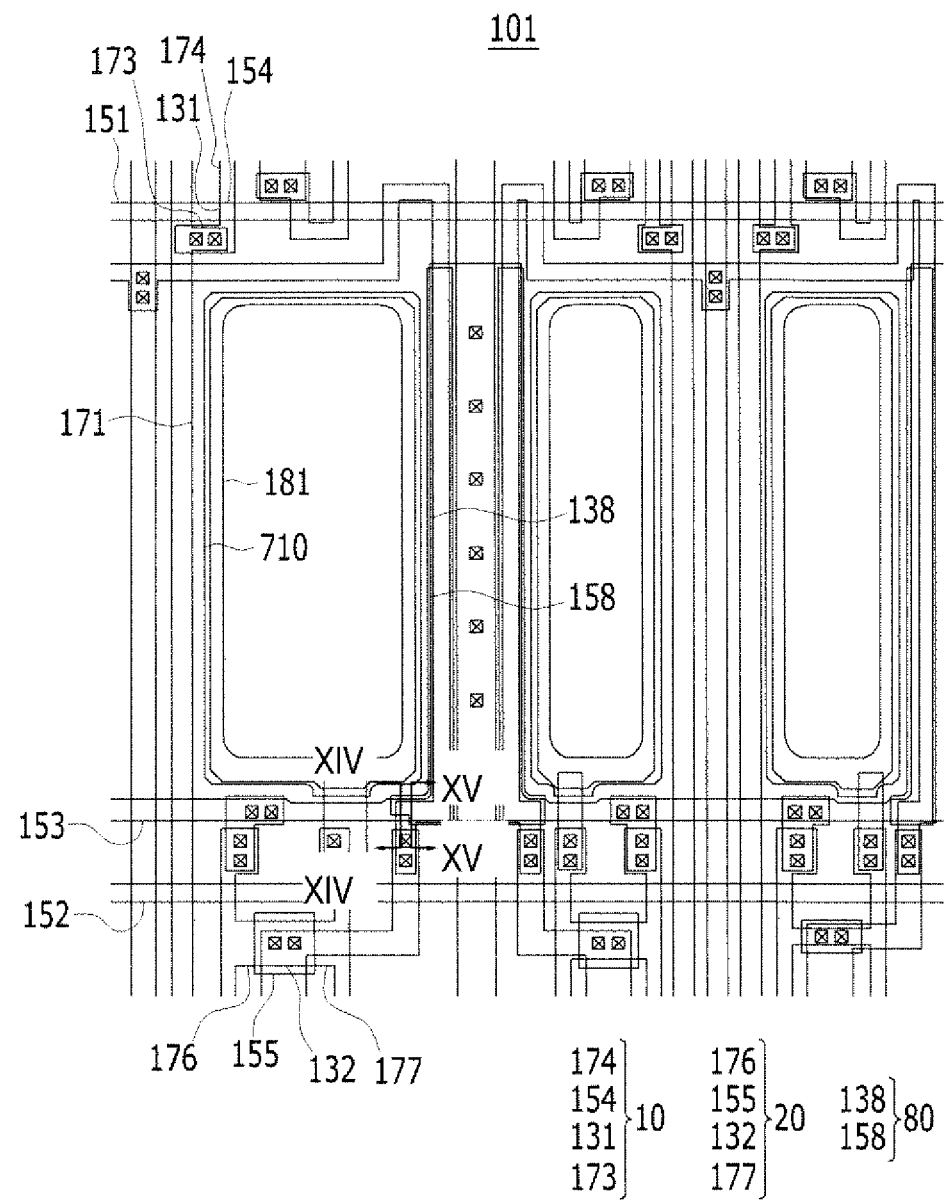

As shown in FIG. 14 and FIG. 15, the photoresist layer 800 is then patterned to form a photoresist layer pattern 801, and then, as shown in FIG. 16, a first conductive layer pattern (151, 152, 153, 154, 155, 158, and 710) and a second conductive layer pattern (171, 173, 174, 176, and 177) are formed through a photolithography process using the photoresist layer pattern 801. That is, while forming the second conductive layer pattern (171, 173, 174, 176, and 177), the first conductive layer pattern intermediates 1510, 1520, 1530, 1540, 1550, 1580, and 7100 are partially etched to complete the first conductive layer pattern (151, 152, 153, 154, 155, 158, and 710) together. The first conductive layer pattern intermediates 1510, 1520, 1530, 1540, 1550, 1580, and 7100 that are partially etched may be a second capacitor electrode 158 intermediate and a pixel electrode 710 intermediate.

Figure 17:
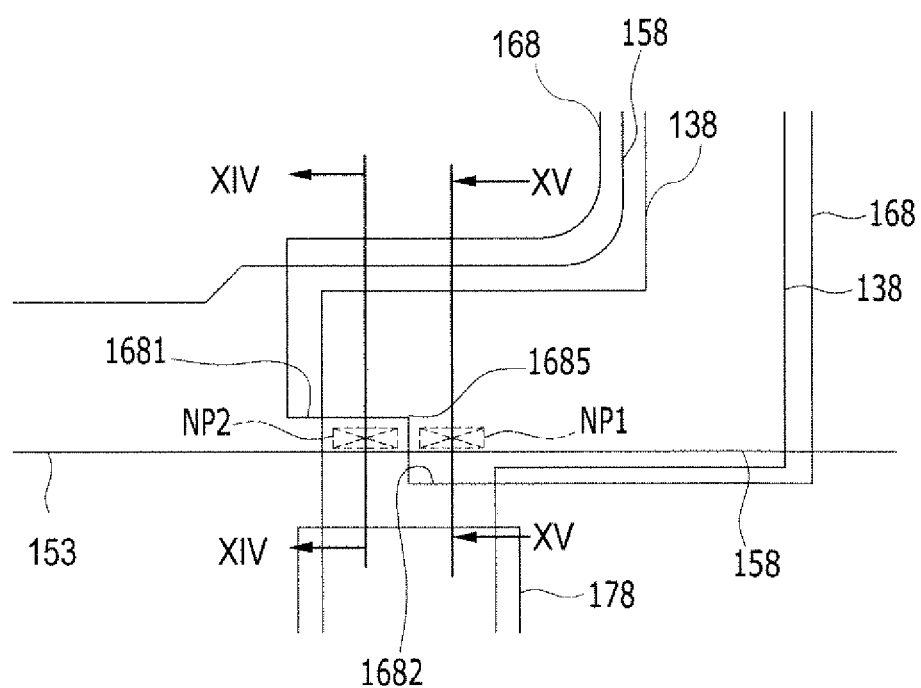

FIG. 16 illustrates a perspective view of the patterns formed by the above stated processes, and FIG. 17 is a close-up view of a portion of FIG. 16 adjacent lines XVII-XVII and XVIII-XVIII.

As shown in FIG. 16 and FIG. 17, the first conductive layer pattern (151, 152, 153, 154, 155, 158, and 710) includes a gate (scan) line 151, a capacitor line 153, source electrodes 154 and 155, the second capacitor electrode 158, and the pixel electrode 710.

Also, the second conductive layer pattern (171, 173, 174, 176, and 177) includes a data line 171, source electrodes 173 and 174, and drain electrodes 176 and 177. Reference numeral 178 of FIG. 14 and FIG. 15 indicates an extension extended from the drain electrode 177.

Also, as shown in FIG. 14 and FIG. 15, the second capacitor electrode 158 is mainly formed of a single transparent conductive layer 1581 that is exposed through the capacitor opening 168. That is, a plurality of metal layers 1582, 1583, and 1584 that are formed on the transparent conductive layer 1581 are removed together in the process of forming the second conductive layer pattern (171, 173, 174, 176, and 177).

As described above, the second capacitor electrode 158 exposed through the capacitor opening 168 must be formed of the single transparent conductive layer, however, as shown in FIG. 14 and FIG. 15, the photoresist material flows into the space formed when the portion side surface of the second capacitor electrode 158 is undercut such that the metal layer 1582 unnecessarily remains on the transparent conductive layer 1581 in a portion of the region of the second capacitor electrode 158.

Next, an impurity is doped in the first capacitor electrode 138. The impurity may be of a P type or N type. The impurity may be various materials known to a skilled person in the art.

The impurity transmits to the second capacitor electrode 158 exposed through the capacitor opening 168 and made of the single transparent conductive layer 1581 and is doped to the first capacitor electrode 138 through transparent conductive layer 1581 and gate insulating layer 140.

On the other hand, as described above, the portion of the second capacitor electrode 158 that is exposed through the capacitor opening 168 but where the metal layer 1582 remains on the transparent conductive layer 1581 prevents the transmission of the impurity.

Accordingly, as shown in FIG. 17, the first capacitor electrode 138 has a first non-doping region NP1 where the doping of the impurity is blocked by the second capacitor electrode 158 where the metal layer remains. The first non-doping region NP1 faces the second transverse side wall 1682 of the above-described capacitor opening 168.

Also, the first capacitor electrode 138 includes a second non-doping region NP2 facing the first transverse side wall 1681 of the capacitor opening 168 and overlapping the interlayer insulating layer 160. The second non-doping region NP2 is covered by the interlayer insulating layer 160 such that the plurality of metal layers 1582, 1583, and 1584 of the second capacitor electrode 158 are removed, and thereby the impurity is not doped.

As described above, the first capacitor electrode 138 has the region having high resistance because of the first non-doping region NP1 and the second non-doping region NP2. However, the first capacitor electrode 138 facing the longitudinal side wall 1685 of the capacitor opening 168 is doped with the impurity. Accordingly, the first capacitor electrode 138 is doped with the impurity between the first non-doping region NP1 and the second non-doping region NP2, thereby ensuring a path of electricity having relatively low resistance.

Meanwhile, if the capacitor opening 168 is independently formed of the first transverse side wall 1681 or the second transverse side wall 1682, the non-doping region intersects the first capacitor electrode 138 such that a deterioration of the circuit driving according to a resistance increase is generated.

However, in the first exemplary embodiment, the capacitor opening 168 has the structure respectively forming the first transverse side wall 1681 and the second transverse side wall 1682 and connecting them through the longitudinal side wall 1685 on the first capacitor electrode 138, and thereby the doping region may be ensured between the non-doping regions NP1 and NP2 such that the path of the electricity may be effectively ensured.

Also, the pixel electrode 710 may be made of the single transparent conductive layer along with the portion of the region of the second capacitor electrode 158.

Next, although not shown, a pixel definition layer is formed on the second conductive layer pattern (171, 173, 174, 176, and 177). The pixel definition layer has, as shown in FIG. 16, a pixel opening 181 exposing the pixel electrode 710. Also, although not shown, an organic emission layer and a common electrode are sequentially formed on the pixel definition layer to form an organic light emitting element.

A low molecular weight organic material or a high molecular weight organic material may be used for the organic emission layer. The organic emission layer includes a hole transport layer and a hole injection layer in the direction of the pixel electrode 710 with respect to the emission layer, and also includes an electron transport layer and an electron injection layer in the direction of the common electrode (not shown). In addition, various layers can be stacked if needed.

Also, the organic light emitting diode (OLED) display 101 according to the first exemplary embodiment uses the pixel electrode 710 as an anode and the common electrode (not shown) as a cathode. However, the exemplary embodiment is not restricted thereto, and the polarities of the pixel electrode 710 and the common electrode (not shown) may be opposite.

Also, in the first exemplary embodiment, the common electrode (not shown) is made of a material including a reflecting material. That is, the organic light emitting diode (OLED) display 101 has a rear light emission structure. In detail, the common electrode (not shown) may be made of Al, Ag, Mg, Li, Ca, LiF/Ca, or LiF/Al.

Although not shown, the organic light emitting diode (OLED) display 101 may further include a sealing member for preventing permeation of moisture or oxygen into the organic emission layer (not shown).

The organic light emitting diode (OLED) display 101 manufactured by the above-described manufacturing method according to the first exemplary embodiment suppresses the deterioration of the circuit driving due to the non-doping region of the impurity in the first capacitor electrode 138 of the capacitor 80.

Next, an organic light emitting diode (OLED) display 102 and a manufacturing method according to a second exemplary embodiment will be described with reference to FIG. 18 to FIG. 23.

The manufacturing method according to the present embodiment is the same as the first exemplary embodiment until forming the first conductive layer pattern intermediates 1510, 1520, 1530, 1540, 1550, 1580, and 7100.

Figure 18:
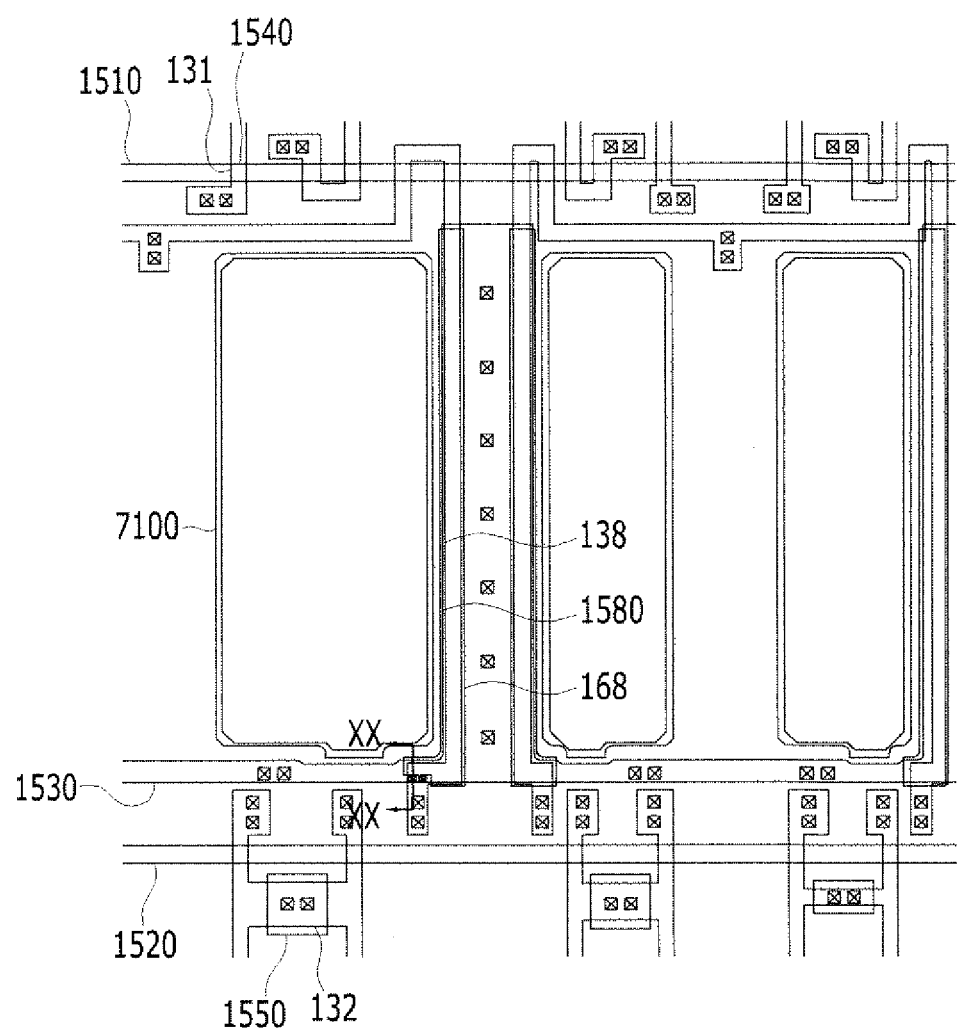
FIG. 18 to FIG. 23 are layout views and cross-sectional views sequentially showing a manufacturing process of an organic light emitting diode (OLED) display according to a second exemplary embodiment.
Figure 19:
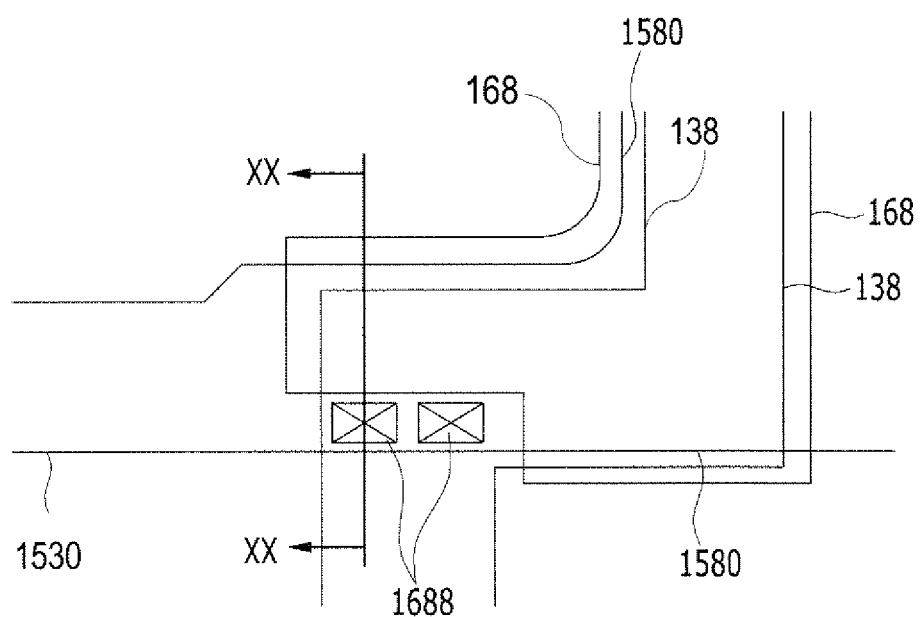

FIG. 18 and FIG. 19 illustrates a perspective view of the patterns formed by the processes of the second exemplary embodiment, where FIG. 19 is a close-up view of FIG. 16 adjacent line XX-XX.

As shown in FIG. 18 and FIG. 19, an interlayer insulating layer 160 covering the first conductive layer pattern intermediates 1510, 1520, 1530, 1540, 1550, 1580, and 7100 is formed. Also, the interlayer insulating layer 160 is partially etched to form a capacitor opening 168 exposing the portion of the second capacitor electrode intermediate 1580 and at least one doping hole 1688.

The doping hole 1688 overlaps a portion of the second capacitor electrode intermediate 1580 and the first capacitor electrode 138, and is positioned near the capacitor opening 168.

Also, the etching process for forming the capacitor opening 168 includes a cleaning process using a solution including hydrofluoric acid (HF).

Figure 20:
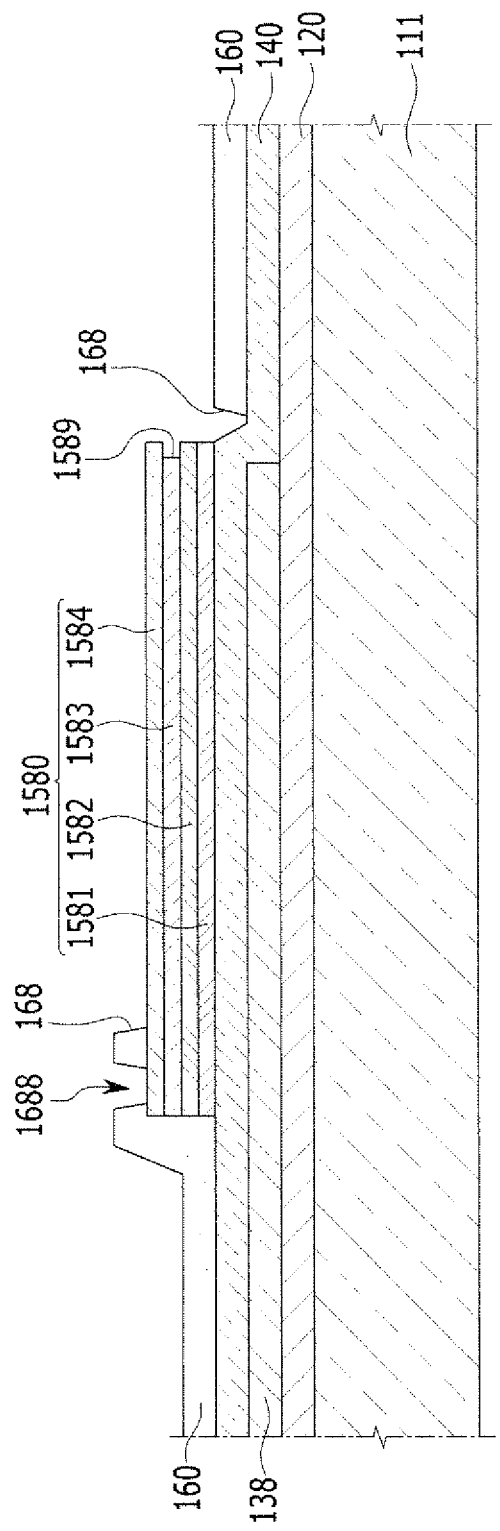

FIG. 20 illustrates a cross-sectional view of a portion of FIG. 19 corresponding to line XX-XX.

As shown in FIG. 20, the undercut 1589 is generated in the second capacitor electrode intermediate 1580 having the side surface exposed through the capacitor opening 168 of the interlayer insulating layer 160. This is because at least one metal layer (1583) among the plurality of metal layers 1582, 1583, and 1584 forming the second capacitor electrode intermediate 1580 is eroded by the hydrofluoric acid solution.

Figure 21:
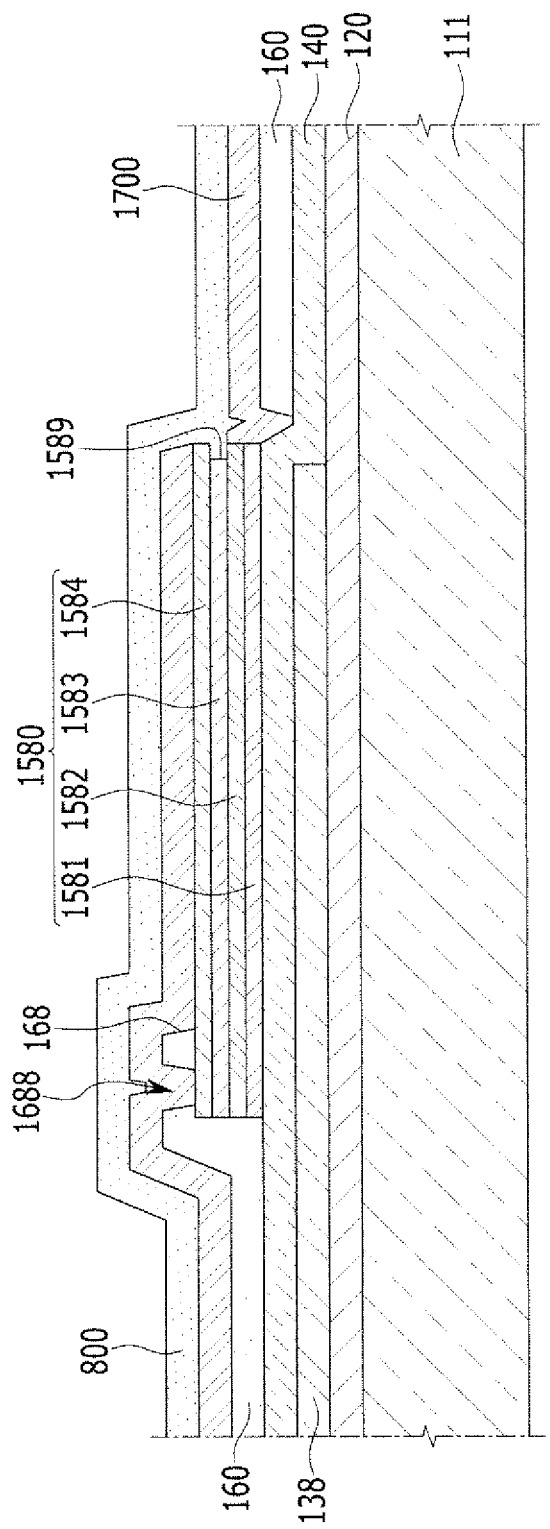

FIG. 21 illustrates a next process of forming a second conductive layer pattern and a photoresist layer on the substrate according to the second exemplary embodiment Next, as shown in FIG. 21, a conductive layer 1700 for forming the second conductive layer pattern (171, 173, 174, 176, and 177) is formed on the first conductive layer pattern intermediates 1510, 1520, 1530, 1540, 1550, 1580, 7100 and the interlayer insulating layer 160, and the photoresist layer 800 is coated thereon.

Figure 22:
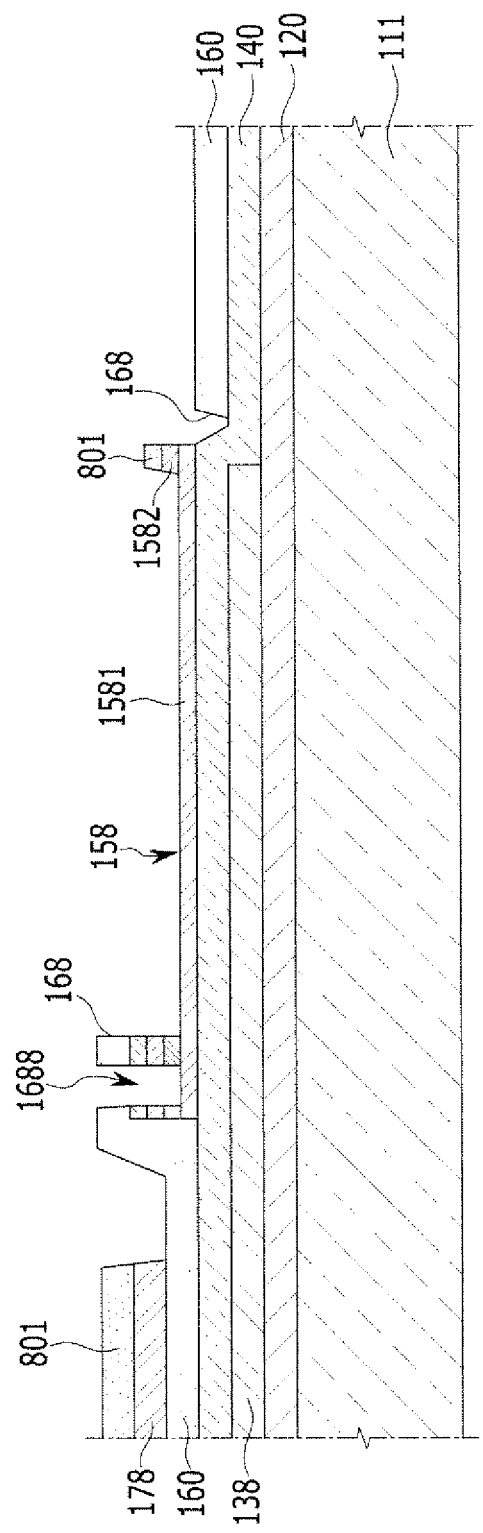

FIG. 22 illustrate a next process of patterning the photoresist layer and performing a photolithography process.

In FIG. 22, after the photoresist layer 800 is patterned to form the photoresist layer pattern 801, the first conductive layer pattern (151, 152, 153, 154, 155, 158, and 710) and the second conductive layer pattern (171, 173, 174, 176, and 177) are formed through the photolithography process using the photoresist layer pattern 801. That is, while forming the second conductive layer pattern (171, 173, 174, 176, and 177), the first conductive layer pattern intermediates 1510, 1520, 1530, 1540, 1550, 1580, and 7100 are partially etched to complete the first conductive layer pattern (151, 152, 153, 154, 155, 158, and 710) together. The first conductive layer pattern intermediates 1510, 1520, 1530, 1540, 1550, 1580, and 7100 that are partially etched may be the second capacitor electrode 158 intermediate and the pixel electrode 710 intermediate.

Figure 23:
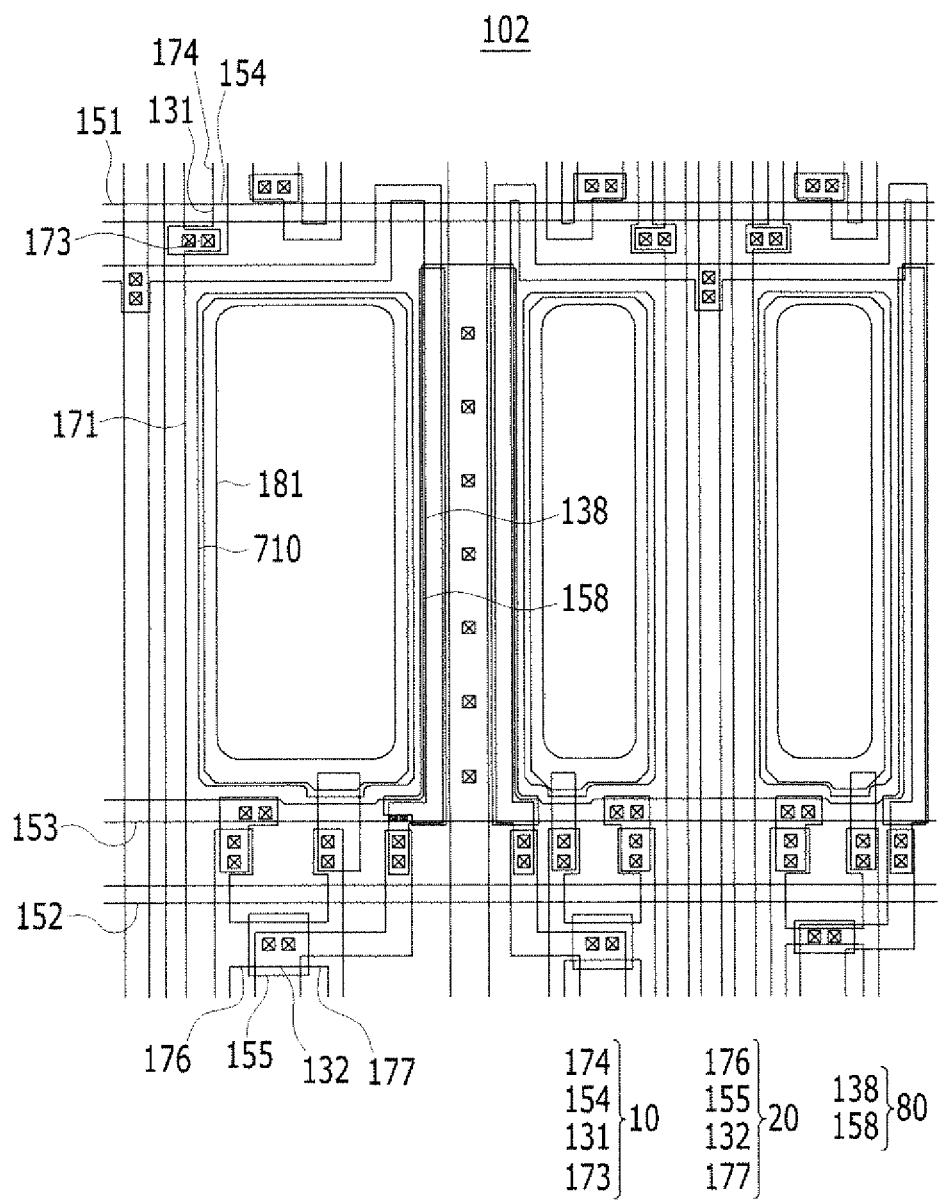

As shown in FIG. 23, the first conductive layer pattern (151, 152, 153, 154, 155, 158, and 710) includes a gate line 151, a capacitor line 153, source electrodes 154 and 155, the second capacitor electrode 158, and a pixel electrode 710.

Also, the second conductive layer pattern (171, 173, 174, 176, and 177) includes a data line 171, source electrodes 173 and 174, and drain electrodes 176 and 177. Reference numeral 178 of FIG. 22 is an expansion extended from the drain electrode 177.

Also, as shown in FIG. 22, most of the second capacitor electrode 158 exposed through the capacitor opening 168 is formed with the single transparent conductive layer 1581. That is, a plurality of metal layers 1582, 1583, and 1584 that are formed on the transparent conductive layer 1581 are removed together in the process of forming the second conductive layer pattern (171, 173, 174, 176, and 177).

As described above, the second capacitor electrode 158 exposed through the capacitor opening 168 should be formed with the single transparent conductive layer, however as shown in FIG. 14 and FIG. 15, the photoresist material flows into the space formed when the side surface of the portion of the second capacitor electrode 158 is undercut such that the metal layer 1582 unnecessarily remains in the portion of the region of the second capacitor electrode 158 on the transparent conductive layer 1581.

Also, while covering the interlayer insulating layer 160, a plurality of metal layers 1582, 1583, and 1584 of the second capacitor electrode 158 are removed via the doping hole 1688 in the region where the first capacitor electrode 138 and the second capacitor electrode 158 overlap each other such that the single transparent conductive layer 1581 is removed.

Next, the first capacitor electrode 138 is doped with an impurity. The impurity may be a P type or an N type. The impurity may include various materials known to a skilled person in the art.

The impurity transmits to the second capacitor electrode 158 exposed through the capacitor opening 168 and the doping hole 1688 and formed with the single transparent conductive layer 1581, and is doped to the first capacitor electrode 138.

On the other hand, as described above, the portion of the second capacitor electrode 158 that is exposed through the capacitor opening 168 but where the metal layer 1582 remains on the transparent conductive layer 1581 prevents the transmission of the impurity. However, the metal layer 1582 on the transparent conductive layer 1581 is removed via the doping hole 1688 in the region where the doping hole 1688 is formed such that the impurity is smoothly transmitted to the second capacitor electrode 158 and may be doped to the first capacitor electrode 138.

Also, the metal layers 1582, 1583, and 1584 remain in the relatively small space between the doping hole 1688 and the capacitor opening 168 such that the doping of the impurity may be prevented. However, the impurity is lateral-straggled in the lateral direction by a predetermined distance such that the impurity may be sufficiently diffused to the relatively small gap between the doping hole 1688 and the capacitor opening 168.

Accordingly, the first capacitor electrode 138 may suppress the deterioration of circuit driving due to a region having high resistance by the non-doping of the impurity. That is, the first capacitor electrode 138 is not disconnected by the non-doped region such that the passing path of the electricity may be effectively ensured.

FIG. 23 illustrates a layout view of the patterns forming the organic light emitting diode (OLED) display by the processes of FIGS. 18-22.

Next, a pixel definition layer (not shown), an organic emission layer (not shown), a common electrode (not shown), and a sealing member (not shown) are formed with the same method as the first exemplary embodiment to form an organic light emitting diode (OLED) display 102 according to the second exemplary embodiment, as shown in FIG. 23.

The organic light emitting diode (OLED) display 102 manufactured by the manufacturing method according to the second exemplary embodiment may suppress the deterioration of the circuit driving due to the region where the impurity is not doped in the first capacitor electrode 138 of the capacitor 80.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a substrate;
    a semiconductor layer pattern formed on the substrate and including a first capacitor electrode;
    a gate insulating layer covering the semiconductor layer pattern;
    a first conductive layer pattern formed on the gate insulating layer and including a second capacitor electrode having at least a portion overlapping the first capacitor electrode;
    an interlayer insulating layer including a capacitor opening exposing a portion of the second capacitor electrode and at least one doping hole overlapping the second capacitor electrode and the first capacitor electrode and exposing a portion of the second capacitor electrode near the capacitor opening, and covering the second capacitor electrode; and
    a second conductive layer pattern formed on the interlayer insulating layer.

2. The organic light emitting diode (OLED) display of claim 1, wherein the first capacitor electrode overlapped by at least one doping hole is a semiconductor layer doped with an impurity.

3. The organic light emitting diode (OLED) display of claim 1, wherein a portion of a region of the first conductive layer pattern is formed of a single transparent conductive layer, and another portion of the region is formed of a transparent conductive layer and a plurality of metal layers deposited on the transparent conductive layer.

4. The organic light emitting diode (OLED) display of claim 3, wherein the capacitor opening is formed through an etching process, and the etching process includes a cleaning process using a solution including hydrofluoric acid (HF).

5. The organic light emitting diode (OLED) display of claim 4, wherein at least one metal layer among the plurality of metal layers except for the highest layer is relatively more easily eroded by the hydrofluoric acid solution than the highest layer.

6. The organic light emitting diode (OLED) display of claim 4, wherein at least one metal layer among the plurality of metal layers except for the highest layer includes aluminum.

7. The organic light emitting diode (OLED) display of claim 3, wherein at least a portion of the second capacitor electrode of the first conductive layer pattern exposed through the capacitor opening is formed of a single transparent conductive layer.

8. The organic light emitting diode (OLED) display of claim 7, wherein the first capacitor electrode overlapped by the second capacitor electrode formed of the single transparent conductive layer is doped with an impurity.

9. An organic light emitting diode (OLED) display comprising:
    a substrate;
    a semiconductor layer pattern formed on the substrate and including a first capacitor electrode;
    a gate insulating layer covering the semiconductor layer pattern;
    a first conductive layer pattern formed on the gate insulating layer and including a second capacitor electrode having at least a portion overlapping the first capacitor electrode;
    an interlayer insulating layer having a capacitor opening exposing the portion of the second capacitor electrode and covering the second capacitor electrode, the interlayer insulating layer including least one doping hole overlapping the second capacitor electrode and the first capacitor electrode and exposing a portion of the second capacitor electrode near the capacitor opening; and
    a second conductive layer pattern formed on the interlayer insulating layer,
    the capacitor opening including a first transverse side wall parallel to and overlapping the second capacitor electrode, a second transverse side wall parallel to and not overlapping the second capacitor electrode nor the first capacitor electrode, and a longitudinal side wall connecting the first transverse side wall and the second transverse side wall to each other and overlapping the first capacitor electrode.

10. The organic light emitting diode (OLED) display of claim 9, the first capacitor electrode overlapped by the longitudinal side wall of the capacitor opening being a semiconductor layer doped with an impurity via the doping hole.

11. The organic light emitting diode (OLED) display of claim 10, the first capacitor ele ctrode having a region not doped with an impurity.

* * * * *